(12) United States Patent
Yoshikawa et al.

(10) Patent No.: US 7,616,362 B2
(45) Date of Patent: Nov. 10, 2009

(54) HOLOGRAM RECORDING AND REPRODUCING APPARATUS

(75) Inventors: Hiroyasu Yoshikawa, Kawasaki (JP); Kouichi Tezuka, Kawasaki (JP); Kazushi Uno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/359,190

(22) Filed: Feb. 22, 2006

(65) Prior Publication Data

US 2006/0221795 A1 Oct. 5, 2006

(30) Foreign Application Priority Data

Mar. 30, 2005 (JP) ............................. 2005-098123

(51) Int. Cl.
G03H 1/00 (2006.01)
G03H 1/10 (2006.01)
G03H 1/22 (2006.01)

(52) U.S. Cl. ................................ 359/10; 359/1; 359/32
(58) Field of Classification Search .................... 359/22
See application file for complete search history.

(56) References Cited

U.S. PATENT DOCUMENTS

| 5,777,760 | A | * | 7/1998 | Hays et al. ..................... 359/7 |
| 5,822,090 | A | | 10/1998 | Wilde |
| 5,838,650 | A | | 11/1998 | Campbell et al. |
| 5,850,299 | A | * | 12/1998 | Lande et al. ................... 359/1 |
| 5,920,536 | A | | 7/1999 | Campbell et al. |
| 6,414,763 | B1 | * | 7/2002 | Hesselink et al. ............. 359/21 |
| 6,490,061 | B1 | * | 12/2002 | Tanaka et al. ................. 359/22 |
| 6,721,076 | B2 | * | 4/2004 | King et al. ..................... 359/35 |
| 7,251,066 | B2 | * | 7/2007 | Chao et al. .................... 359/22 |
| 2002/0075776 | A1 | | 6/2002 | Kasazumi et al. |
| 2003/0223101 | A1 | * | 12/2003 | Curtis et al. ................... 359/3 |

FOREIGN PATENT DOCUMENTS

| JP | 10-97792 | 4/1998 |
| JP | 2002-216359 | 8/2002 |
| WO | WO 2004/112045 | 12/2004 |

* cited by examiner

Primary Examiner—Stephone B Allen
Assistant Examiner—Jade R Callaway
(74) Attorney, Agent, or Firm—Fujitsu Patent Center

(57) ABSTRACT

A hologram recording and reproducing apparatus includes a movable galvanomirror, a mirror controller and a reproduction unit. The galvanomirror guides a reference beam toward a hologram recording medium and changes the incident angle of the reference beam. The mirror controller causes the galvanomirror to move for adjusting the incident angle to a predetermined angle for hologram recording. In reproducing the recorded information, the mirror controller causes the galvanomirror to move, so that the incident angle continuously changes within a predetermined range including the predetermined angle. The reproduction unit receives a detection signal from an optical detector while the incident angle changes continuously. The detection signal corresponds to the intensity of a reflected beam from the hologram recording medium. The reproduction unit reproduces the recorded information, based on the detection signal, when the intensity of the reflected beam is over a predetermined level or reaches the maximum.

12 Claims, 4 Drawing Sheets

HOLOGRAM RECORDING AND REPRODUCING APPARATUS

BACKGROUND OF THE INVENTION

1. Field of the Invention

The present invention relates to a hologram recording and reproducing apparatus for recording a hologram in a hologram recording medium and reproducing the information recorded in the hologram.

2. Description of the Related Art

A conventional hologram recording and reproducing apparatus is disclosed in JP-A-2002-216359, for example. The hologram recording and reproducing apparatus is basically configured as shown in FIG. 6(a). Specifically, a laser beam emitted by a laser source (not shown) is split into a recording beam S and a reference beam R, out of which the recording beam S is modulated by a spatial light modulator 500 into a light representing two-dimensional information and then emitted onto a recording layer 92 of a hologram recording medium B at a predetermined incident angle, through an objective lens 700. Meanwhile, the reference beam R is directed to the hologram recording medium B by a galvanomirror 900 and condenser lenses 100A, 100B, so as to intersect with the recording beam S on the recording layer 92 of the hologram recording medium B. The incident angle of the reference beam R with respect to the hologram recording medium B can be adjusted at different angles via an operation of the galvanomirror 900, as shown in solid lines and broken lines in FIG. 6(a). As a result, the recording beam S and the reference beam R create interference fringes that constitute a hologram H on the recording layer 92 of the hologram recording medium B, and different patterns of interference fringes are multi-recorded in the hologram H, according to the incident angle of the reference beam R.

For reproduction of the information recorded in the hologram H, the reference beam R is emitted onto the hologram recording medium B at the same incident angle as that at the time of recording, and the light returning from the hologram recording medium B (herein after, reflected beam) is received by a photodetector (not shown). Such reflected beam is emitted from the hologram recording medium B at an output angle that is the same as the incident angle of the recording beam S, thus reproducing the recording beam S. Accordingly, based on a detected signal by the photodetector which has received the reflected beam, the two-dimensional information (recorded information) contained in the recording beam S can be reproduced.

For better understanding on the reproduction principle of the hologram H, description on wave number vector space will be given referring to FIG. 6(b). The wave number vector space is defined as a unit circle K having a radius represented by a wave number ($2\pi/\lambda$), which is the inverse number of a value obtained via dividing the wavelength $\lambda$ of the emitted laser beam by $2\pi$. When the recording beam S is designated by a wave number vector Ks and the reference beam R corresponding to a certain incident angle is designated by a wave number vector Kr, the directions of the recording beam S and the reference beam R correspond to the directions of the wave number vectors Ks, Kr, and the respective initial points of the wave number vectors Ks, Kr are placed at the center of the unit circle K. Since the recording beam S and the reference beam R are split from the laser beam emitted by the identical light source, the magnitudes of the wave number vectors Ks, Kr are identical, and the respective terminal points of the wave number vectors Ks, Kr fall on the circumference of the unit circle K. When the hologram H created by the recording beam S and the reference beam R is designated by a wave number vector Kh, the wave number vector Kh of the hologram H can be defined as a composite vector of the wave number vector Ks of the recording beam S and an inverted vector of the wave number vector Kr of the reference beam R, and the initial point and the terminal point of the wave number vector Kh both fall on the circumference of the unit circle K. Accordingly, unless the wave number vector of the hologram does not fit the unit circle, the hologram is not recorded.

Also, the wave number vector of the reflected beam at the time of reproduction can be defined as a composite vector (not shown) of the wave number vector Kr of the reference beam R and the wave number vector Kh of the hologram H. Based on this, when the wave number vector Kr of the reference beam R at the time of reproduction is the identical vector as that at the time of recording, the wave number vector of the reflected beam results the same as the wave number vector Ks of the recording beam S. Consequently, unless the wave number vector of the reflected beam does not fit the same unit circle as that of the wave number vector of the reference beam at the time of reproduction, the hologram cannot be reproduced.

In the conventional hologram recording and reproducing apparatus, however, the intensity of the laser beam emitted by the light source may fluctuate between at the time of recording and at the time of reproduction. Such fluctuation in the laser beam intensity may lead to a difference in wavelength between at the time of recording and at the time of reproduction, thus inhibiting the detection of the reflected beam at the time of reproduction.

To be more detailed, when the wavelength at the time of reproduction is longer than that at the time of recording, a unit circle K' of the wave number vector space and a wave number vector Kr' of the reference beam R are formed, as indicated by broken lines in FIG. 7(a). The unit circle K' at the time of reproduction becomes smaller than the unit circle K at the time of recording. Accordingly, even though the wave number vector Kr' of the reference beam R at the time of reproduction is oriented in the same direction as that at the time of recording, the wave number vector of the reflected beam does not fit the unit circle K' corresponding to the wave number vector Kr', and therefore, based on the principle, the reflected beam cannot be obtained.

Likewise, when the wavelength at the time of reproduction is shorter than that at the time of recording, a unit circle K" of the wave number vector space and a wave number vector Kr" of the reference beam R are formed, as indicated by broken lines in FIG. 7(b). The unit circle K" at the time of reproduction becomes larger than the unit circle K at the time of recording. Accordingly, even though the wave number vector Kr" of the reference beam R at the time of reproduction is oriented in the same direction as that at the time of recording, the wave number vector of the reflected beam does not fit the unit circle K" corresponding to the wave number vector Kr", and therefore, based on the principle, the reflected beam cannot be obtained.

SUMMARY OF THE INVENTION

The present invention has been conceived in view of the foregoing situation, with an object to provide a hologram recording and reproducing apparatus capable of surely detecting a reflected beam and thereby reproducing recorded information, even when the wavelength at the time of reproduction is different from that at the time of recording.

To achieve the foregoing object, the present invention provides the following technical solution.

According to the present invention, there is provided a hologram recording and reproducing apparatus. In this apparatus, coherent light is split into a recording beam and a reference beam, and the recording beam and the reference beam are superposed on a hologram recording medium for recording a hologram on the hologram recording medium. Then, the hologram recording medium is irradiated with the reference beam for reproducing recorded information based on the hologram, and the reflected beam from the hologram recording medium is detected with an optical detector.

The apparatus of the present invention comprises: a movable optical device that guides the reference beam toward the hologram recording medium, and that changes an incident angle of the reference beam with respect to the hologram recording medium; an optical device controller that causes the movable optical device to move so as to set the incident angle at a predetermined angle in recording the hologram on the hologram recording medium, the optical device controller also causing the movable optical device to move, in reproduce the recorded information based on the hologram, so that the incident angle continuously changes within a predetermined range including the predetermined angle; and a reproduction unit that receives a detection signal from the optical detector while the incident angle changes continuously, the detection signal corresponding to intensity of the reflected beam, the reproduction unit reproducing the recorded information based on the detection signal when the intensity of the reflected beam is no lower than a predetermined level or reaches a maximum level.

Preferably, the predetermined angle may be set at a plurality of different values for performing hologram multi-recording on the hologram recording medium. The incident angle is set at the respective different values in reproducing the recorded information based on the hologram, and for each of the different values, the incident angle is continuously changed within a predetermined range including each of the different values.

Preferably, the movable optical device may comprise a galvanomirror.

With the above-described features, it is possible to produce a sufficiently intense reflected beam in performing the reproduction of information recorded on the hologram recording medium, even when the wavelength at the time of reproduction is different from the wavelength at the time of recording. According to the present invention, this is achieved by slightly shifting the incident angle of the reference beam at the time of reproduction from a predetermined angle, that is, the incident angle of the reference beam at the time of recording. A reflected beam having sufficient intensity contributes to reliable detection of the beam, hence to proper reproduction of the information recorded on the hologram recording medium.

Other features and benefits of the present invention will become more apparent through the detailed description given hereunder referring to the accompanying drawings.

DETAILED DESCRIPTION OF THE PREFERRED EMBODIMENTS

The present invention will now be described in details, referring to the accompanying drawings. FIGS. 1 through 5 are related to the embodiment of a hologram recording and reproducing apparatus according to the present invention.

Figure 1:
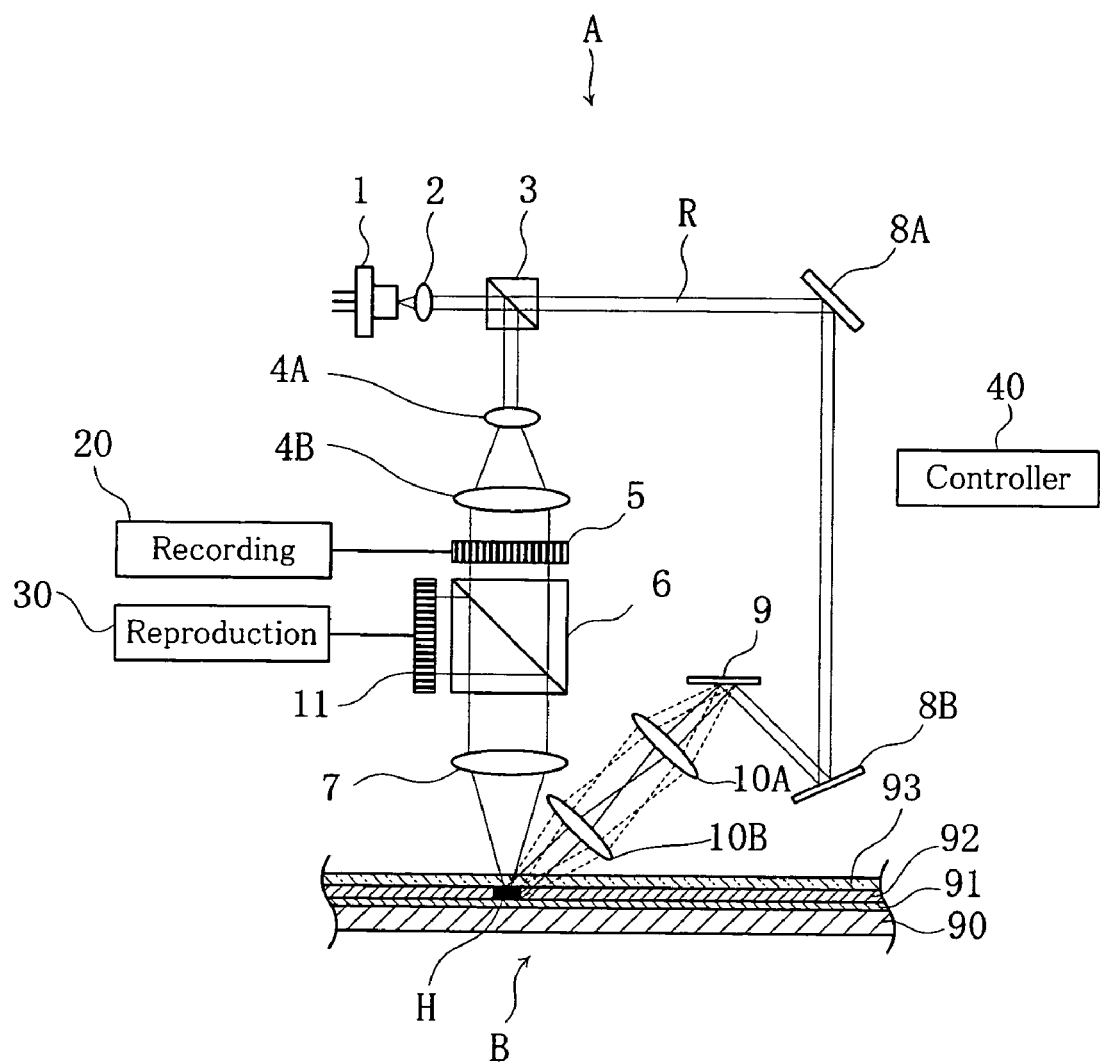
FIG. 1 is a schematic diagram showing an overall configuration of a hologram recording and reproducing apparatus according to an embodiment of the present invention.

As shown in FIG. 1, the hologram recording and reproducing apparatus A according to this embodiment includes a light source 1, a collimator lens 2, a first beam splitter 3, beam expanders 4A, 4B, a spatial light modulator 5, a second beam splitter 6, an objective lens 7, fixed mirrors 8A, 8B, a movable optical device 9, condenser lenses 10A, 10B, a photodetector (optical detector) 11, a recording unit 20, a reproduction unit 30, and a controller (optical device controller) 40. Other constituents not shown include a rotating mechanism that rotates a disk serving as a hologram recording medium designated by B, and a moving mechanism that moves an optical system including the objective lens 7 in a radial direction of the hologram recording medium B. A hologram recording medium B employed in the hologram recording and reproducing apparatus A includes a substrate 90, a reflection layer 91, a recording layer 92, and a protection layer 93 stacked on one another. In the recording layer 92, a hologram H is recorded through the interference between a recording beam S and a reference beam R, and a light from the hologram H is emitted to the objective lens as a reflected beam.

The light source 1 is constituted of for example a semiconductor laser device, which emits a laser beam in a form of a highly interferential coherent light of a relatively narrow frequency band, when recording or reproducing. The collimator lens 2 converts the laser beam emitted by the light source 1 into a parallel light. The laser beam output from the collimator lens 2 is led to the first beam splitter 3, which splits the laser beam received into the recording beam S directed to the spatial light modulator 5 and the reference beam R directed to the galvanomirror 9 through a different optical path.

The beam expanders 4A, 4B are constituted of combined lenses and serve to enlarge the diameter of the recording beam S and lead the recording beam S to the spatial light modulator 5. The spatial light modulator 5 is constituted of an LCD device or a deformable mirror device, which modulates the light received at the time of recording into a light representing two-dimensional information (recording beam S) and outputs the same. The spatial light modulator 5 is driven based on a recording signal from the recording unit 20 generated in accordance with the information to be recorded. The recording beam S output from the spatial light modulator 5 is transmitted through the second beam splitter 6 and the objective lens 7, thus to be incident upon the hologram recording medium B. At the time of reproduction, the recording beam S is not emitted onto the hologram recording medium B, because the spatial light modulator 5 is not driven. In this embodiment, the objective lens 7 is disposed such that the recording beam S is made generally perpendicularly incident upon the hologram recording medium B (i.e. with an incident angle of 0 degrees).

Meanwhile, the reference beam R output from the first beam splitter 3 is led through the fixed mirror 8A, 8B to the movable optical device 9. The movable optical device 9 is constituted of a galvanomirror that can change the incident angle and the reflection angle of the reference beam R, and arranged so as to guide the reference beam R toward the hologram recording medium B. The operation of the movable optical device 9 is controlled based on a driving signal from the controller 40. The reference beam R output from the movable optical device 9 is transmitted through the condenser lenses 10A, 10B, thus to be incident upon the hologram recording medium B. At the time of recording, the reference beam R is incident upon the recording layer 92 of the hologram recording medium B so as to intersect with the recording beam S, while at the time of reproduction the reference beam R is emitted so as to interfere with the hologram H already recorded in the recording layer 92. In this embodiment, the incident angle of the reference beam R with respect to the hologram recording medium B is changed according to the operation of the movable optical device 9.

The photodetector 11, which may be constituted of a CCD area sensor or a CMOS area sensor, receives the light returning from the hologram recording medium B through the objective lens 7 and the second beam splitter 6 (reflected beam) at the time of reproduction. The photodetector 11 outputs a detection signal according to the intensity of the reflected beam which has been received, to the reproduction unit 30. The reproduction unit 30 receives the detected signal representing the intensity equal to or greater than a predetermined level, so as to reproduce the recorded information based on the detection signal.

The following passages cover an operation of the hologram recording and reproducing apparatus A.

Figure 2:
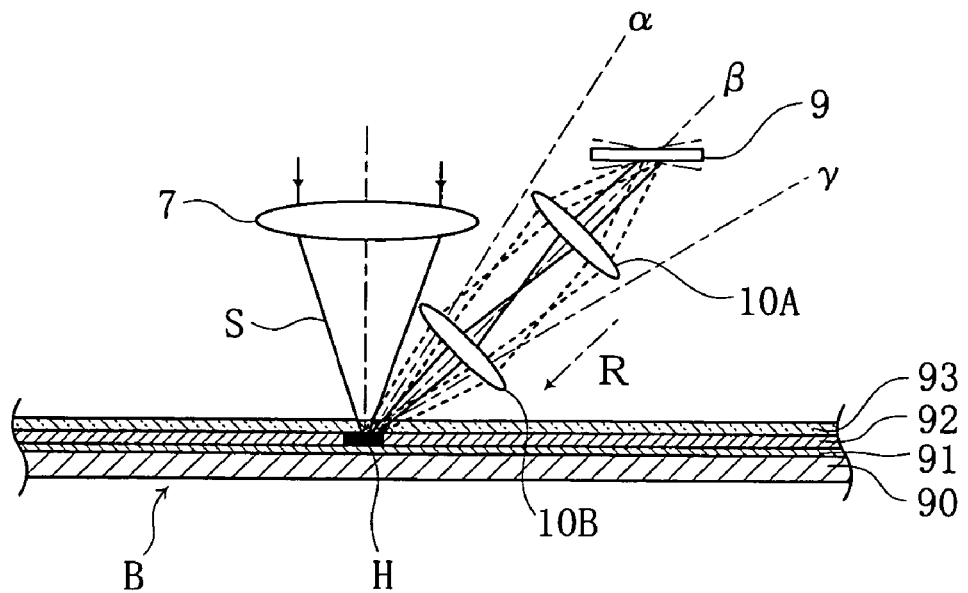
FIG. 2 is a schematic diagram for explaining a recording operation of the hologram recording and reproducing apparatus of FIG. 1.

When recording a hologram on the hologram recording medium B, the recording beam S and the reference beam R are incident upon the recording layer 92, so as to intersect with each other thereon as shown in FIG. 2, so that the hologram H is recorded in the recording layer 92. At this stage, the incident angle of the reference beam R is adjusted to different angles (predetermined angles) such as $\alpha$, $\beta$, $\gamma$, by the operation of the movable optical device 9. As a result, different interference fringe patterns corresponding to each incident angle $\alpha$, $\beta$, $\gamma$ of the reference beam R are multi-recorded in the hologram H. To increase the recording density of such multi-recording, it is preferable to increase the thickness of the recording layer 92, and to change the incident angle of the reference beam R in finer increments.

Figure 4:
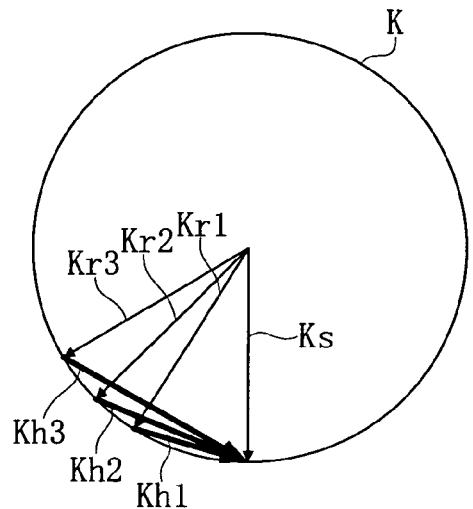
FIG. 4 is a diagram for explaining a wave number vector space at the time of recording.
Figure 5:
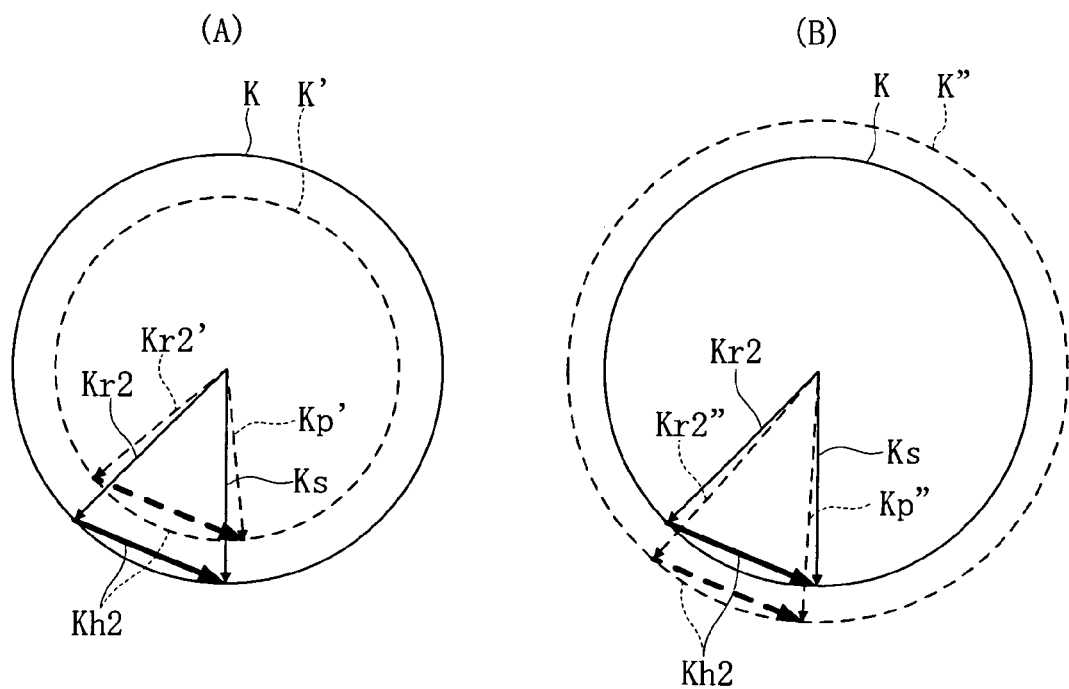
FIG. 5 is a diagram for explaining a wave number vector space at the time of reproduction.
Figure 6:
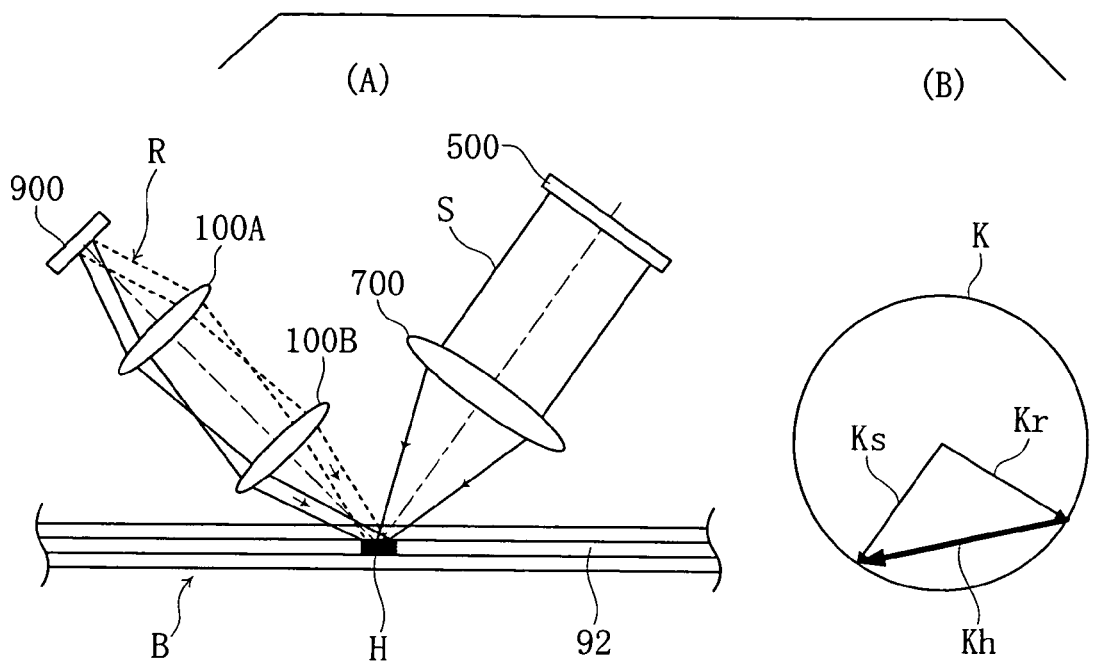
FIG. 6 is a diagram for explaining a conventional hologram recording and reproducing apparatus.
Figure 7:
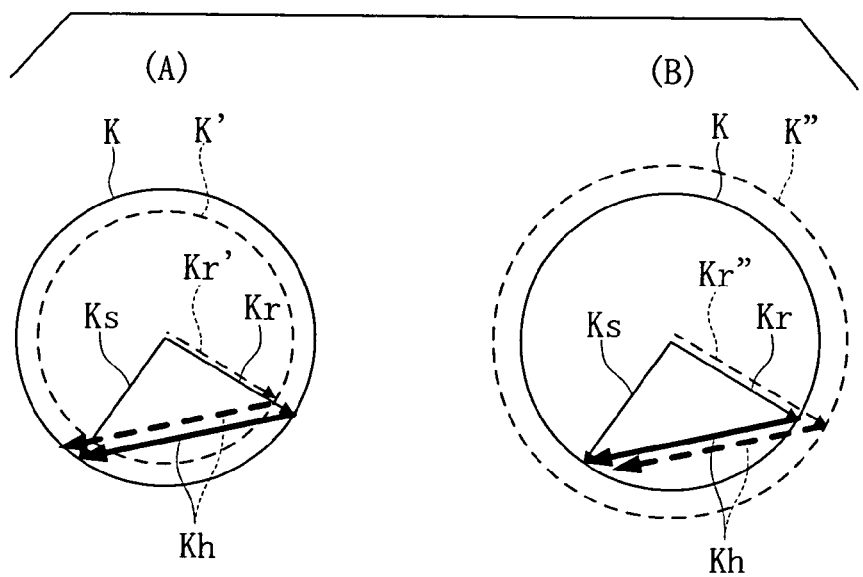
FIG. 7 is a diagram for explaining a wave number vector space at the time of reproduction by the conventional apparatus.

Wave number vectors of the recording beam S, the reference beam R, and the hologram H at the time of recording can be handled in a wave number vector space as shown in FIG. 4. The wave number vector space is represented by a unit circle K having a radius corresponding to the wave number ($2\pi/\lambda$, that is, the inverse number of a value obtained via dividing the wavelength $\lambda$ by $2\pi$) of the laser beam at the time of recording, in which the wave number vector of the recording beam S is designated by Ks, and the wave number vectors of the reference beam R are designated by Kr1, Kr2, Kr3, respectively corresponding to the incident angles $\alpha$, $\beta$, $\gamma$. The wave number vectors of the hologram H are defined as Kh1, Kh2, Kh3, respectively corresponding to the incident angles $\alpha$, $\beta$, $\gamma$ of the reference beam R. At the time of recording, the wavelength of the recording beam S and that of the reference beam R are always identical, and hence the wave number vectors Kh1, Kh2, Kh3 of the hologram H fit the circumference of the unit circle K. Accordingly, the recorded information representing all the interference stripe patterns corresponding to the wave number vectors Kh1, Kh2, Kh3 is surely recorded in the hologram H.

Figure 3:
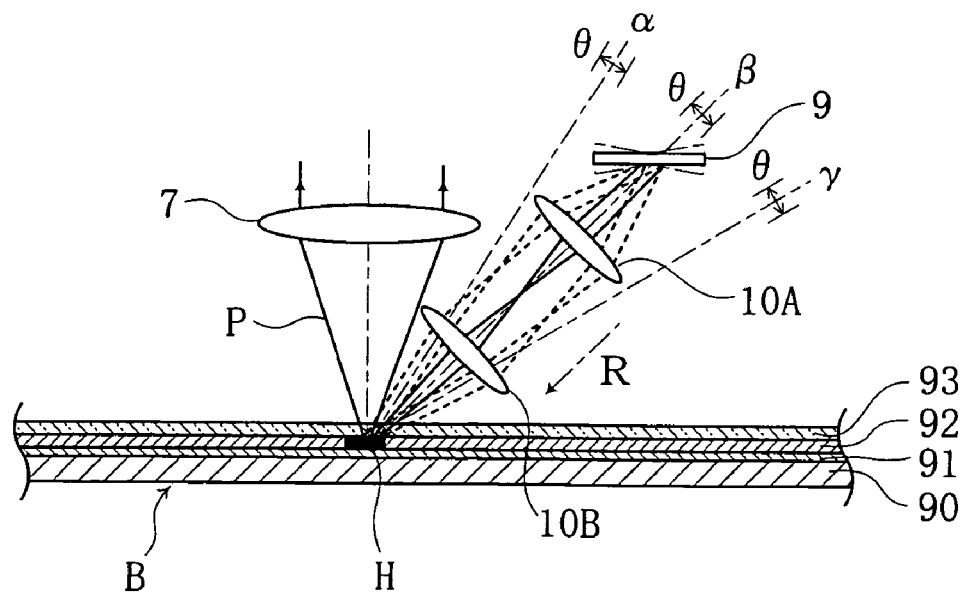
FIG. 3 is a schematic diagram for explaining a reproducing operation of the hologram recording and reproducing apparatus of FIG. 1.

When reproducing the recorded information out of the hologram recording medium B in which the hologram H has thus been recorded, the movable optical device 9 is activated so as to adjust the incident angle of the reference beam R to the angles $\alpha$, $\beta$, $\gamma$ used at the time of recording as shown in FIG. 3, and in the area close to each angle $\alpha$, $\beta$, $\gamma$, the incident angle is continuously changed within a predetermined angle range $\theta$. The angle range $\theta$ is set to be sufficiently narrower than the interval among the angles $\alpha$, $\beta$, $\gamma$. Basically, when the wavelength of the laser beam at the time of reproduction is identical to the wavelength at the time of recording, adjusting the incident angle of the reference beam at the time of reproduction to the same angles $\alpha$, $\beta$, $\gamma$ leads to emission of the reflected beam P because of the interference between the hologram H and the reference beam R. However, the intensity of the laser beam emitted by the light source 1 may be intentionally changed or may spontaneously fluctuate depending on the operating condition, between at the time of recording and at the time of reproduction. Fluctuation in intensity of the laser beam leads to fluctuation in wavelength, thereby inhibiting the emission of the reflected beam P with sufficient intensity. To avoid such incident, the incident angle of the reference beam R is, though basically adjusted to the angle $\alpha$, $\beta$, $\gamma$ used when recording, continuously changed within the predetermined angle range $\theta$ at the time of reproduction.

Based on the wave number vector space shown in FIG. 5(a)-(b), a reason of such arrangement will be explained. Referring to the wave number vector Kh2 of the hologram H for example, when the wavelength at the time of reproduction is longer than the wavelength at the time of recording, a unit circle K' representing a wave number vector space indicated by broken lines shown in FIG. 5(a) is created, which is smaller than the unit circle K corresponding to the wavelength at the time of recording. However, the magnitude and orientation of the wave number vector Kh2 of the hologram H are not changed. Upon joining the wave number vector Kh2 to the wave number vector Kr2' of the reference beam R keeping the wave number vector Kh2 on the circumference of the unit circle K', a wave number vector Kp' of the reflected beam P is obtained on the unit circle K' corresponding to the reproduction, as the composite vector. Here, the orientation of the wave number vector Kr2' of the reference beam R at the time of reproduction is slightly shifted from the orientation of the wave number vector Kr2 at the time of recording, and hence the reflected beam P represented by the wave number vector Kp' cannot be obtained unless the incident angle at the time of reproduction is made greater than that at the time of recording. Though the reflected beam P is slightly shifted in orientation from the recording beam S, the amount of shift is within a permissible range. Therefore the reflected beam P surely forms an image at the photodetector 11, and can hence be detected because of its sufficient intensity. Here, a reflected beam P that is strictly identical to the recording beam S cannot be obtained since the wave number vector Kp' of the reflected beam P is different in magnitude from the wave number vector Ks of the recording beam S, however correcting the phase of the reflected beam P permits obtaining the reflected beam P that is substantially the same as the recording beam S.

The foregoing also applies when the wavelength at the time of reproduction is shorter than the wavelength at the time of recording, in which case a unit circle K" representing a wave number vector space indicated by broken lines shown in FIG. 5(b) is created, which is larger than the unit circle K corresponding to the wavelength at the time of recording. Upon joining the wave number vector Kh2 of the hologram H to the wave number vector Kr2" of the reference beam R keeping the wave number vector Kh2 on the circumference of the unit circle K", a wave number vector Kp" of the reflected beam P is obtained on the unit circle K" corresponding to the reproduction, as the composite vector. Here, the orientation of the wave number vector Kr2" of the reference beam R at the time of reproduction is slightly shifted from the orientation of the wave number vector Kr2 at the time of recording, and hence the reflected beam P represented by the wave number vector Kp" cannot be obtained unless the incident angle at the time of reproduction is made smaller than that at the time of recording. Though such reflected beam P is also slightly shifted in orientation from the recording beam S, the amount of shift is within a permissible range. Therefore the reflected beam P is clearly captured by the photodetector 11, and can hence be detected because of its sufficient intensity. With such reflected beam P also, correcting the phase thereof permits obtaining the reflected beam P that is substantially the same as the recording beam S.

At the time of reproduction, the incident angle of the reference beam R is continuously changed within the predetermined angle range θ based on the foregoing principle, and once an appropriate incident angle is obtained, a detection signal not lower than a predetermined level is output by the photodetector 11 to the reproduction unit 30. The reproduction unit 30 then reproduces the recorded information based on the detection signal not lower than the predetermined level. Accordingly, the recorded information thus reproduced results exactly the same as the information recorded in the hologram H. It is to be noted that the reproduction unit 30 may be set to receive by buffering all the detection signals output by the photodetector 11 while the incident angle of the reference beam R is continuously changed within the predetermined angle range θ, so as to reproduce the recorded information based on the detection signal of the maximum level.

Consequently, the hologram recording and reproducing apparatus A changes the incident angle of the reference beam R at the time of reproduction within the predetermined angle range θ, and slightly shifts the incident angle from the incident angles (predetermined angles) α, β, γ at the time of recording, thereby creating the reflected beam P having sufficient intensity and surely detecting the reflected beam P thus to reproduce the information recorded in the hologram H, even when the wavelength at the time of reproduction is different from that at the time of recording.

It is to be understood that the present invention is not limited to the foregoing embodiments.

The foregoing embodiment employs a reflection-type hologram recording medium B, and hence the hologram recording medium B is irradiated with the recording beam S and the reference beam R from the same direction. When employing a transmission-type hologram recording medium without a reflection layer, the reference beam may be emitted from opposite directions at the time of recording and at the time of reproduction. More specifically, an optical system such as the movable optical device may be provided on both sides of the hologram recording medium, for example so as to emit, at the time of recording, the reference beam onto a face of the hologram recording medium via the movable optical device placed on one side, and to emit, at the time of reproduction, the reference beam onto the other face of the hologram recording medium via the movable optical device placed on the other side, at generally the same incident angle as that at the time of recording.

The invention claimed is:

1. A hologram recording and reproducing apparatus in which coherent light emitted from a light source is split into a recording beam and a reference beam, the recording beam and the reference beam being superposed on a hologram recording medium for recording a hologram on the hologram recording medium, and in which the hologram recording medium is irradiated with the reference beam for reproducing recorded information based on the hologram, and a reflected beam from the hologram recording medium is detected with an optical detector, the apparatus comprising:
   a movable optical device that guides the reference beam toward the hologram recording medium, and that changes an incident angle of the reference beam with respect to the hologram recording medium;
   an optical device controller that causes the movable optical device to move so as to set the incident angle at a specified angle in recording the hologram on the hologram recording medium, the optical device controller also causing the movable optical device to move in reproducing the recorded information based on the hologram so that the incident angle of the reference beam with respect to the hologram recording medium increases from the specified angle when the wavelength of the coherent light emitted from the light source becomes greater at the time of reproducing than at the time of recording; and
   a reproduction unit that receives a detection signal from the optical detector while the incident angle changes continuously, the detection signal corresponding to intensity of the reflected beam, the reproduction unit reproducing the recorded information based on the detection signal when the intensity of the reflected beam is no lower than a specified level or reaches a maximum level;
   wherein the specified angle is set at a plurality of different values for performing hologram multi-recording on the hologram recording medium; and
   wherein the incident angle is set at the respective different values in reproducing the recorded information based on the hologram, and for each of the different values, the incident angle is continuously changed from said each of the different values within a specified range when the wavelength of the coherent light emitted from the light source becomes greater at the time of reproducing than at the time of recording, said specified range being narrower than an interval between the different values.

2. The hologram recording and reproducing apparatus according to claim 1, wherein the movable optical device comprises a galvanomirror.

3. The hologram recording and reproducing apparatus according to claim 1, wherein the incident angle is continuously changed from said each of the different values with the specified range to compensate for fluctuations occurring between the time of recording and the time of reproducing.

4. The hologram recording and reproducing apparatus according to claim 3, wherein the fluctuations are spontaneous fluctuations.

5. A hologram recording and reproducing apparatus in which coherent light emitted from a light source is split into a recording beam and a reference beam, the recording beam and the reference beam being superposed on a hologram recording medium for recording a hologram on the hologram recording medium, and in which the hologram recording medium is irradiated with the reference beam for reproducing recorded information based on the hologram, and a reflected beam from the hologram recording medium is detected with an optical detector, the apparatus comprising:

a movable optical device that guides the reference beam toward the hologram recording medium, and that changes an incident angle of the reference beam with respect to the hologram recording medium;

an optical device controller that causes the movable optical device to move so as to set the incident angle at a specified angle in recording the hologram on the hologram recording medium, the optical device controller also causing the movable optical device to move in reproducing the recorded information based on the hologram so that the incident angle of the reference beam with respect to the hologram recording medium decreases from the specified angle when the wavelength of the coherent light emitted from the light source becomes shorter at the time of reproducing than at the time of recording; and a reproduction unit that receives a detection signal from the optical detector while the incident angle changes continuously, the detection signal corresponding to intensity of the reflected beam, the reproduction unit reproducing the recorded information based on the detection signal when the intensity of the reflected beam is no lower than a specified level or reaches a maximum level;

wherein the specified angle is set at a plurality of different values for performing hologram multi-recording on the hologram recording medium; and wherein the incident angle is set at the respective different values in reproducing the recorded information based on the hologram, and for each of the different values, the incident angle is continuously changed from said each of the different values within a specified range when the wavelength of the coherent light emitted from the light source becomes shorter at the time of reproducing than at the time of recording, said specified range being narrower than an interval between the different values.

6. The hologram recording and reproducing apparatus according to claim 5, wherein the movable optical device comprises a galvanomirror.

7. The hologram recording and reproducing apparatus according to claim 5, wherein the incident angle is continuously changed from said each of the different values with the specified range to compensate for fluctuations occurring between the time of recording and the time of reproducing.

8. The hologram recording and reproducing apparatus according to claim 7, wherein the fluctuations are spontaneous fluctuations.

9. A hologram recording and reproducing apparatus in which coherent light emitted from a light source is split into a recording beam and a reference beam, the recording beam and the reference beam being superposed on a hologram recording medium for recording a hologram on the hologram recording medium, and in which the hologram recording medium is irradiated with the reference beam for reproducing recorded information based on the hologram, and a reflected beam from the hologram recording medium is detected with an optical detector, the apparatus comprising:

a movable optical device that guides the reference beam toward the hologram recording medium, and that changes an incident angle of the reference beam with respect to the hologram recording medium;

an optical device controller that causes the movable optical device to move so as to set the incident angle at a specified angle in recording the hologram on the hologram recording medium, the optical device controller also causing the movable optical device to move in reproducing the recorded information based on the hologram so that the incident angle of the reference beam with respect to the hologram recording medium increases from the specified angle when the wavelength of the coherent light emitted from the light source becomes greater at the time of reproducing than at the time of recording, the optical device controller further causing the movable optical device to move in reproducing the recorded information based on the hologram so that the incident angle of the reference beam with respect to the hologram recording medium decreases from the specified angle when the wavelength of the coherent light emitted from the light source becomes shorter at the time of reproducing than at the time of recording; and a reproduction unit that receives a detection signal from the optical detector while the incident angle changes continuously, the detection signal corresponding to intensity of the reflected beam, the reproduction unit reproducing the recorded information based on the detection signal when the intensity of the reflected beam is no lower than a specified level or reaches a maximum level;

wherein the specified angle is set at a plurality of different values for performing hologram multi-recording on the hologram recording medium; and wherein the incident angle is set at the respective different values in reproducing the recorded information based on the hologram, and for each of the different values, the incident angle is continuously changed from said each of the different values within a specified range when the wavelength of the coherent light emitted from the light source becomes greater or shorter at the time of reproducing than at the time of recording, said specified range being narrower than an interval between the different values.

10. The hologram recording and reproducing apparatus according to claim 9, wherein the movable optical device comprises a galvanomirror.

11. The hologram recording and reproducing apparatus according to claim 9, wherein the incident angle is continuously changed from said each of the different values with the specified range to compensate for fluctuations occurring between the time of recording and the time of reproducing.

12. The hologram recording and reproducing apparatus according to claim 11, wherein the fluctuations are spontaneous fluctuations.

* * * * *